United States Patent [19]

Nakano et al.

[11] Patent Number: 4,788,667
[45] Date of Patent: Nov. 29, 1988

[54] SEMICONDUCTOR MEMORY DEVICE HAVING NIBBLE MODE FUNCTION

[75] Inventors: Masao Nakano, Kawasaki; Yoshihiro Takemae, Tokyo, both of Japan

[73] Assignee: Fujitsu Limited, Kanagawa, Japan

[21] Appl. No.: 895,113

[22] Filed: Aug. 11, 1986

[30] Foreign Application Priority Data

Aug. 16, 1985 [JP] Japan ................................ 60-179445

[51] Int. Cl.⁴ .............................................. G11C 7/00
[52] U.S. Cl. .................................... 365/193; 365/233; 365/230
[58] Field of Search ............... 365/233, 230, 189, 205, 365/207, 208, 193

[56] References Cited

U.S. PATENT DOCUMENTS

| | | | |
|---|---|---|---|
| 4,567,579 | 1/1986 | Patel et al. ........................ | 365/189 |
| 4,675,850 | 6/1987 | Kumanoya et al. ................ | 365/230 |

FOREIGN PATENT DOCUMENTS

| | | | |
|---|---|---|---|
| 0098391 | 6/1984 | Japan ................................. | 365/233 |
| 2152777 | 8/1985 | United Kingdom ................ | 365/230 |

OTHER PUBLICATIONS

International Symposium on VLSI Technology Systems and Applications 1985, May 8–10, 1985, Taipei, Taiwan R.O.C., pp. 14–18 Takasugi et al., "A 64KX4b Nibble Mode DRAM Using Time Multiplexed Data Bus with Master–Slave Data Transfer Architecture".

*Primary Examiner*—Stuart N. Hecker
*Assistant Examiner*—Glenn A. Gossage
*Attorney, Agent, or Firm*—Armstrong, Nikaido, Marmelstein & Kubovcik

[57] ABSTRACT

In the semiconductor memory device havig a nibble mode function, memory cell arrays are divided into two groups of first and second cell blocks. Data bus lines are provided separately to each of the first and second cell blocks. Sense amplifiers are provided separately to each of the data bus lines. A column decoder, for connecting between bit lines, is provided in the memory cell array and corresponding data bus lines based on address signals and gate signals in a selection state. A switching circuit is provided for switching between sense amplifiers belonging to the first cell block and sense amplifiers belonging to the second cell block and for connecting these sense amplifiers to output buffers. A clock signal generating circuit is provided for generating the gate signals. The gate signals are generated in such a way that each gate signal is raised in response to a leading edge of a column address strobe signal and is allowed to fall in response to a trailing edge of the column address strobe signal in the nibble mode.

3 Claims, 13 Drawing Sheets

SEMICONDUCTOR MEMORY DEVICE HAVING NIBBLE MODE FUNCTION

BACKGROUND OF THE INVENTION

1. Field of the Invention

The present invention relates to a semiconductor memory device having a nibble mode function, more particularly to a dynamic type random access memory (DRAM) having an improved nibble mode function.

2. Description of the Related Art

Recently, a DRAM having the nibble mode function has become widely used as a high speed access memory device. A feature of such a nibble mode function is to read data, for example, four bits of data, in parallel from a memory cell array in a read operation. In this case, a nibble mode cycle time has been already normalized and determined by a row address strobe signal and a nibble cycle of a column address strobe signal. That is, a column decoder is "set" or "reset" in response to a trailing or leading edge of the nibble cycle of the column address strobe signal. In this case, the read out data corresponding to a selected column decoder is stored temporarily in four latch means, for example, sense amplifiers. The latched data is sequentially read out through an output buffer means. In the nibble mode function, the latched data can be read at a high speed by "toggling" the column address strobe signal after one of the four latched data is first selected.

As explained above, the nibble mode cycle time is determined in correspondence with the cycle of the column address strobe signal and this cycle is normalized as a specification. In this case, the rise to a high level or the fall to a low level of a gate signal for the column decoder depends on the leading or trailing edge of the column address strobe signal.

Conventionally, in the nibble mode cycle time, the time for a read operation is sufficient, but the time for a write operation is short. This is because the column decoder is early set in order to quickly read out data, and reset in response to a next leading edge of the column address strobe signal. This insufficient write time, however, causes write errors to occur in the write operation.

These problems will be explained in detail hereinafter.

SUMMARY OF THE INVENTION

The object of the present invention is to provide a semiconductor memory device having an improved nibble mode function, which is obtained by improving mutual relationships of a leading edge and trailing edge between a column address strobe signal and a column decoder gate signal, wherein sufficient write time can be obtained without changing the nibble mode cycle, and therefore, a high speed read/write operation can be achieved in the nibble mode function.

In accordance with the present invention, there is provided a semiconductor memory device having a nibble mode function comprising memory cell arrays divided into two groups of first and second cell blocks. Data bus lines are provided separately to each of the first and second cell blocks. Sense amplifiers are provided separately to each of the data bus lines. A column decoder connects between bit lines provided in the memory cell array and corresponding data bus lines based on address signals and gate signals in a selection state. A switching circuit switches between the sense amplifiers belonging to the first cell block and the sense amplifiers belonging to the second cell block, and connects these sense amplifiers to output buffers. A block signal generating circuit generates the gate signals. The gate signals are generated in such a way that each gate signal is raised in response to a leading edge of a column address strobe signal and is allowed to fall in response to a trailing edge of the column address strobe signal in the nibble mode.

DESCRIPTION OF THE PREFERRED EMBODIMENTS

Before describing the preferred embodiments, an explanation will be given of a conventional semiconductor memory device having a nibble mode function.

Figure 1:
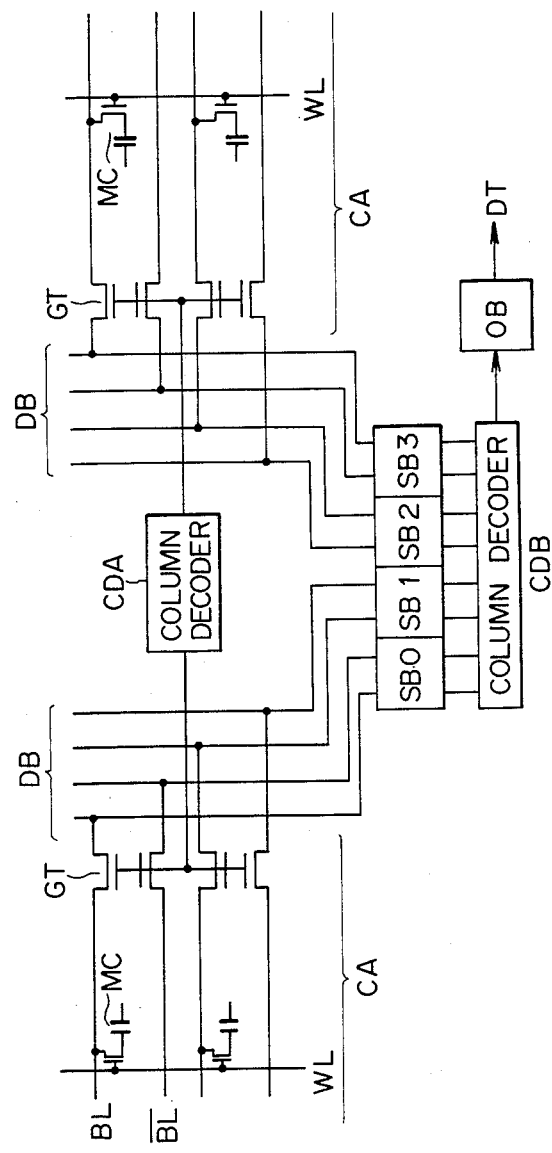
FIG. 1 is a partial circuit diagram of a conventional DRAM having a nibble mode function.

Referring to FIG. 1, CA represents a memory cell array constituted by a plurality of memory cells MC, each memory cell MC being provided at a crossing point of a word line WL and a bit line BL; CDA and CDB represent column decoders; and SB0 to SB3 represent sense buffer amplifiers. The column decoder CDA is connected to bit lines BL and $\overline{BL}$ through each gate transistor GT. The column decoder CDB is connected to the sense buffer amplifier SB0 to SB3. OB represents an output buffer amplifier for amplifying the data, DB represents a plurality of data buses, and DT represents data.

When a potential of the selected word line WL becomes high (H) level, the data in the memory cells MC connected to the word line WL are read out. In FIG. 1, when the column decoder CDA selects these bit lines BL and $\overline{BL}$, four bits of data are simultaneously transferred to the sense amplifiers SB0 to SB3 through the data bus DB. The read data is then latched and amplified in each sense amplifier SB0 to SB3.

In the four bits of data latched in the sense amplifiers SB0 to SB3, one bit of the latched data is selected in the column decoder CDB by using another column address signal which is not transferred to the column decoder CDA. The selected data is amplified in the output buffer OB and output as the read data DT.

Figure 2:
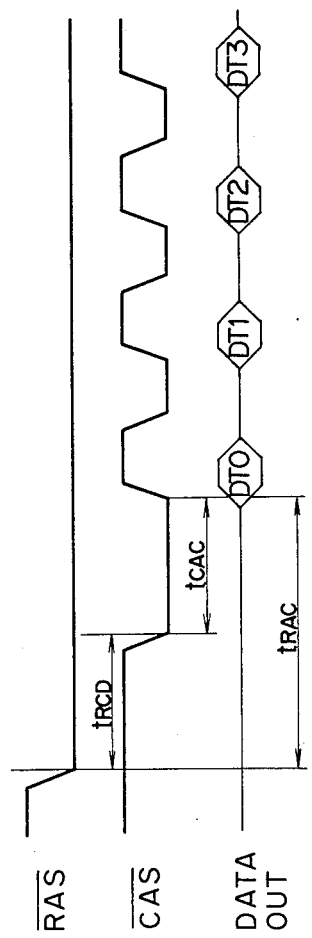
FIG. 2 is a timing chart for the nibble mode in the circuit shown in FIG. 1.

Referring to FIG. 2, $\overline{RAS}$ represents a row address strobe signal and $\overline{CAS}$ a column address strobe signal. The time $t_{RAC}$ represents the $\overline{RAS}$ signal access time from the trailing edge of the $\overline{RAS}$ signal until the first data DT0 is read out. The time $t_{CAC}$ represents the $\overline{CAS}$ signal access time between the trailing edge and the leading edge thereof. The time $t_{RCD}$ represents the delay time from the trailing edge of the $\overline{RAS}$ signal until the trailing edge of the $\overline{CAS}$ signal has fallen.

In the nibble mode, the latched data in the sense buffer amplifiers SB0 to SB3 is sequentially transferred by "toggling" the $\overline{CAS}$ signal through the output buffer amplifier OB as well as an output of a shift register. For example, when the data DT1 in the sense amplifier SB1 is selected by the column address signal, the data DT2 in the sense amplifier SB2 is output in the next nibble cycle. Accordingly, the data DT0 to DT3 in the sense amplifier is sequentially output in the order SB1→SB2→SB3→SB0. This order of the output of the data is repeated by the nibble mode function.

In this case, the $\overline{CAS}$ signal is used as a transfer clock signal having the "toggling" function. By the $\overline{CAS}$ signal, the data is transferred to the sense amplifier SB0 to SB3 and the latched data in the sense amplifier SB1 is output in the first trailing edge of the $\overline{CAS}$ signal. Next, the latched data in the sense amplifier SB2 is output in the second trailing edge of the $\overline{CAS}$ signal, and the data is sequentially output every trailing edge of the $\overline{CAS}$ signal.

The above explained conventional technique is used when the data is sequentially output by every one bit. In this case, four sense amplifiers are necessary to output every one bit.

Further, in a recent technique, a DRAM is known which simultaneously outputs multi bits at every output cycle. In this type of DRAM, a plurality of data, for example, four bits of data, is simultaneously output. Accordingly, for four bits of data, it is necessary to provide sixteen sets ($4 \times 4 = 16$ sets) of data buses, and to provide sixteen sense amplifier circuits ($4 \times 4 = 16$ circuits).

Accordingly, the space needed for wiring and for the sense amplifiers is increased, and power consumption is also increased, in this conventional technique.

Figure 3:
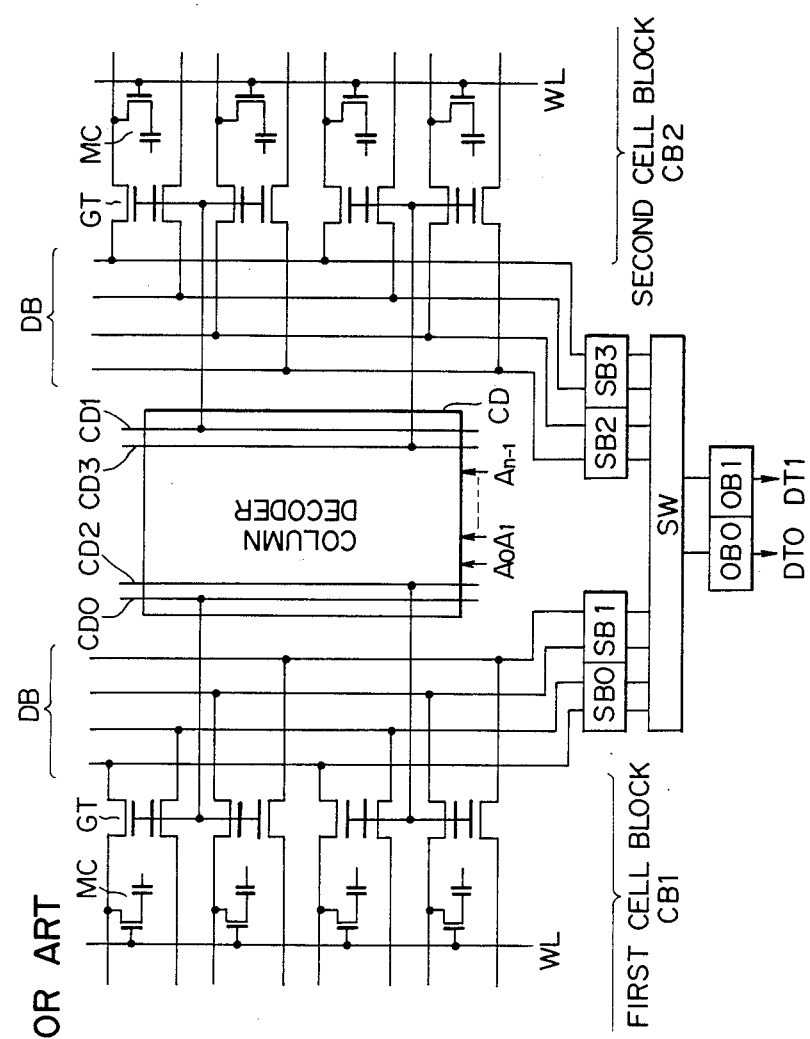
FIG. 3 is a partial circuit diagram of another conventional DRAM having the nibble mode function.
Figure 4:
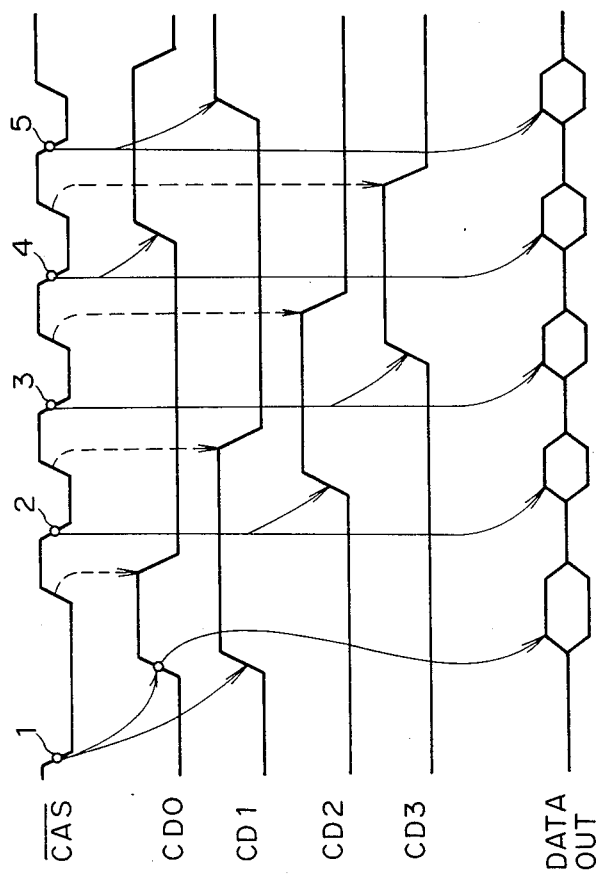
FIG. 4 is a timing chart for the nibble mode in the circuit showing FIG. 3.
Figure 5:
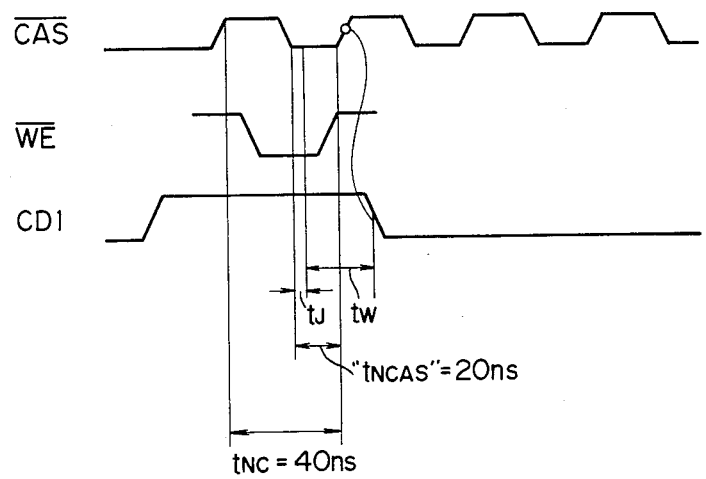
FIG. 5 is a timing chart for explaining a column address strobe signal and write time.

Another conventional technique, which has already solved the above problems, is shown in FIGS. 3 to 5. This DRAM represents a nibble mode DRAM (64 K × 4 bits) using a time-division data bus.

Referring to FIG. 3, CB1 and CB2 represent first and second cell blocks which are divided from the memory cell array, CD a column decoder, SW a sense amplifier switching circuit, and OB0 to OB1 output buffer amplifiers. CD0 to CD3 represent gate signals for opening or closing connections between bit lines and a data bus, in order to transfer the data to the sense amplifiers, and DT0 and DT1 represent data output. In this DRAM, the memory cell array is divided into two groups, i.e., first and second cell blocks as mentioned above, and the data is alternately transferred from each cell block. As shown in FIG. 3, the gate signals CD0 to CD3 are input to the column decoder CD. Two bits of data in the first cell block CB1 are transferred in response to the signal CD0, two bits of data in the second cell block CB2 are transferred in response to the signal CD1, and similarly, the next two bits of data in the CB1 are transferred in response to the signal CD2, and the next two bits of data in the CB2 are transferred in response to the signal CD3.

Referring to FIG. 4, in the first trailing edge of the $\overline{CAS}$ signal shown by reference number 1, signals CD0 and CD1 are raised and the data is taken in to the sense amplifiers SB0 and SB3. The data of the sense amplifiers SB0 and SB1, for example, are selected by the address signal and the selected data DT0 and DT1 are output from the output buffers OB0 and OB1. In the second trailing edge shown by reference number 2, the next data is taken in to the sense amplifiers SB0 and SB1, which have already completed the output of the data by raising the signal CD2. At the same time, the data latched in the sense amplifiers SB2 and SB3 in the previous cycle is output to the output buffers OB0 and OB1.

As explained above, in this conventional technique, the two bits of data are alternately output between the first cell block CB1 and the second cell block CB2. Consequently, the space needed for wiring patterns and sense amplifiers can be reduced by this method.

There are, however, some problems in this nibble mode function, especially in the write operation. That is, as shown in FIG. 4, each of the signals CD0 and CD3 is reset in the trailing edge of the $\overline{CAS}$ signal, as shown by the dotted line, and problems occur in this write mode as explained below.

Referring to FIG. 5, reference letter $\overline{WE}$ represents a write enable signal, CDi (i=0, 1, 2, 3) a gate signal for opening or closing connections between the bit line and the data bus, $t_w$ a write enable time, $t_j$ a judging time for the read/write operation, $t_{NCAS}$ a half of a $\overline{CAS}$ signal cycle, and $t_{NC}$ a nibble mode cycle time of the $\overline{CAS}$ signal. The write signal $\overline{WE}$ is taken in when the $\overline{CAS}$ signal has fallen and the write operation is started after the read or write judgement is made. This write operation must be completed before the gate signal CD$_i$ is reset by the leading edge of the $\overline{CAS}$ signal. That is, in practice, the write operation must be completed during the time $t_w$.

In the nibble mode cycle, the time $t_{NC}$ is, in general, 40 ns (nano second) as a minimum value, and the time $t_{NCAS}$ is, in general, 20 ns, also as a minimum value. However, the time $t_w$ is too short for the write operation, and consequently, errors occur in the write operation.

The semiconductor memory device having a nibble mode function according to the present invention will be explained in detail hereinafter.

The feature of the present invention is to provide a sufficient write time in the nibble mode by controlling the rising and falling timing between the $\overline{CAS}$ signal and the gate signals CD$_i$. Accordingly, a new column decoder CD' is provided instead of conventional column decoder CD as shown in FIG. 8. A new timing chart of each signal is shown in FIG. 7 and a clock signal generating circuit for generating such signals as shown in FIG. 7 is newly provided as shown in FIG. 6.

Figure 6:
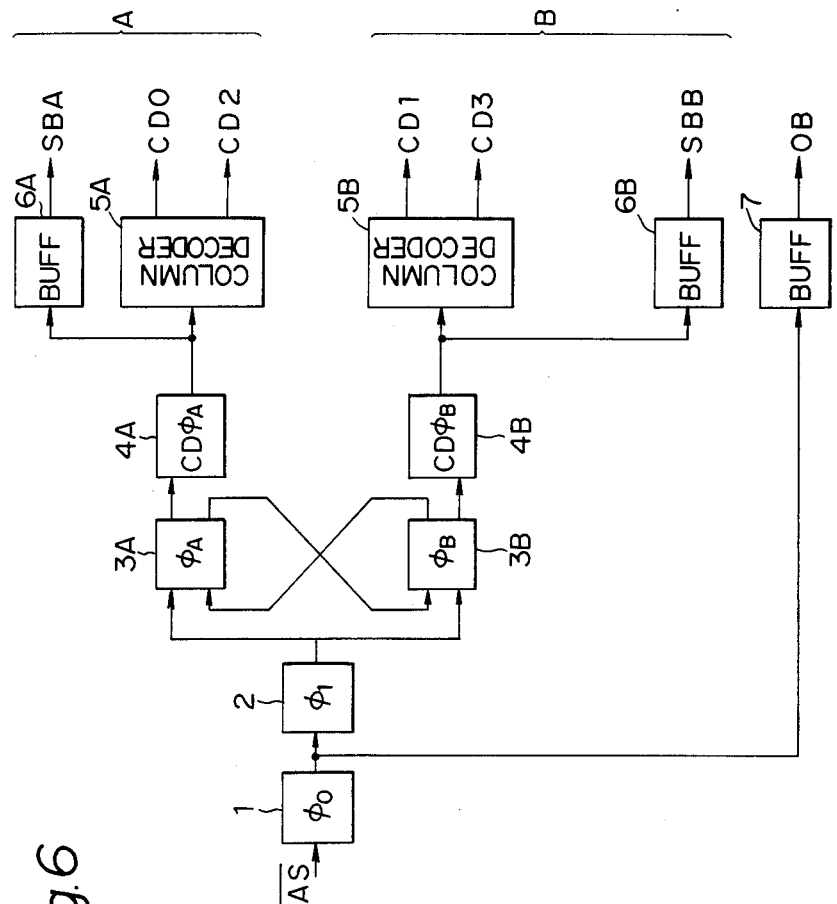
FIG. 6 is a block diagram of a clock signal generating circuit according to an embodiment of the present invention.

Referring to FIG. 6, reference number 1 represents a signal $\phi_0$ generating circuit. The generated signal $\phi_0$ is an inverted and amplified signal of the $\overline{CAS}$ signal. Reference number 2 represents a signal $\phi_1$ generating circuit. The generated signal $\phi_1$ is an inverted signal of the signal $\phi_0$. Reference numbers 3A and 3B represent a signal $\phi_A$ and $\phi_B$ generating circuit. The signals $\phi_A$ and $\phi_B$ are obtained by dividing the frequency of the signal $\phi_1$. Reference numbers 4A and 4B represent a signals CD$\phi_A$ and CD$\phi_B$ generating circuit. The signals CD$\phi_A$ and CD$\phi_B$ are used for driving column decoders 5A and 5B. Reference numbers 6A and 6B represent buffer circuits for generating drive signals SBA and SBB for the sense amplifiers. Reference number 7 represents a buffer circuit for outputting a drive signal OB for the output buffer amplifier. This clock signal generating circuit is divided into two groups, A and B. Group A corresponds to the first cell block CB1 and group B corresponds to the second cell block CB2, as shown in FIG. 8 of the memory cell array. These two groups A and B are alternately operated in the nibble mode.

Figure 7:
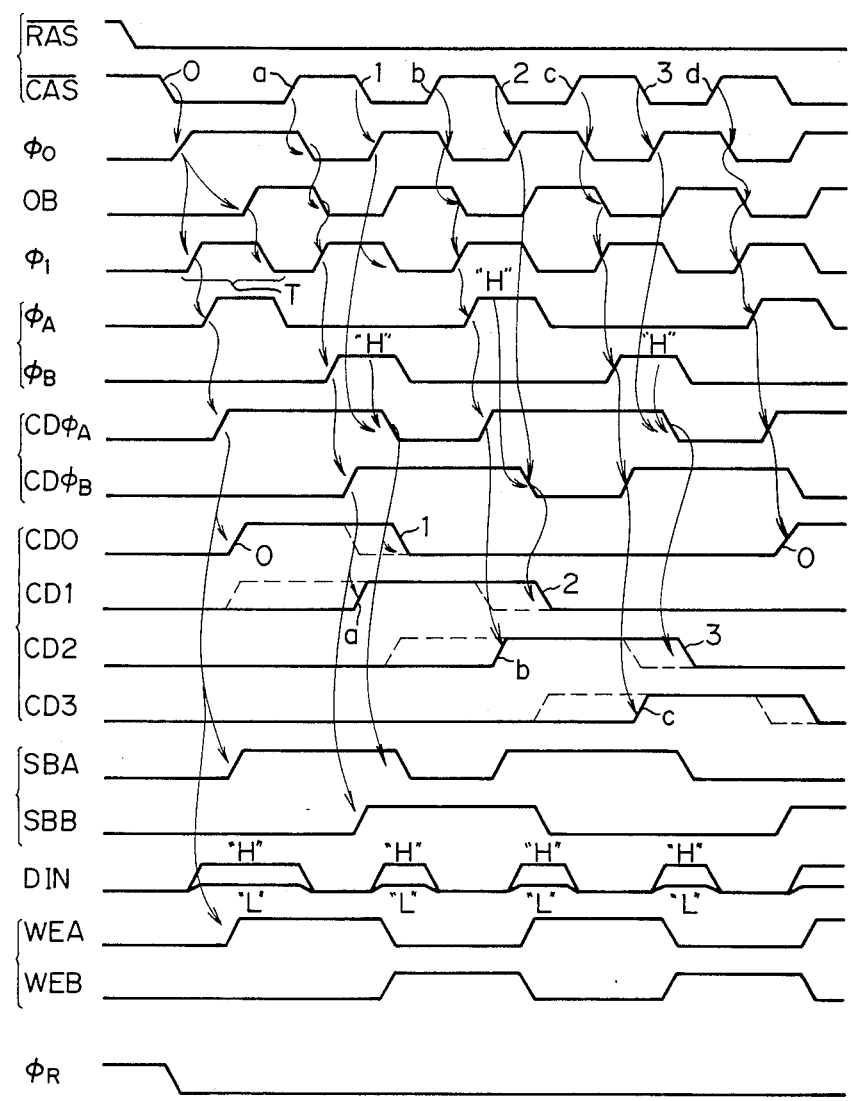
FIG. 7 is a timing chart of each of the clock signals and other signals.
Figure 8:
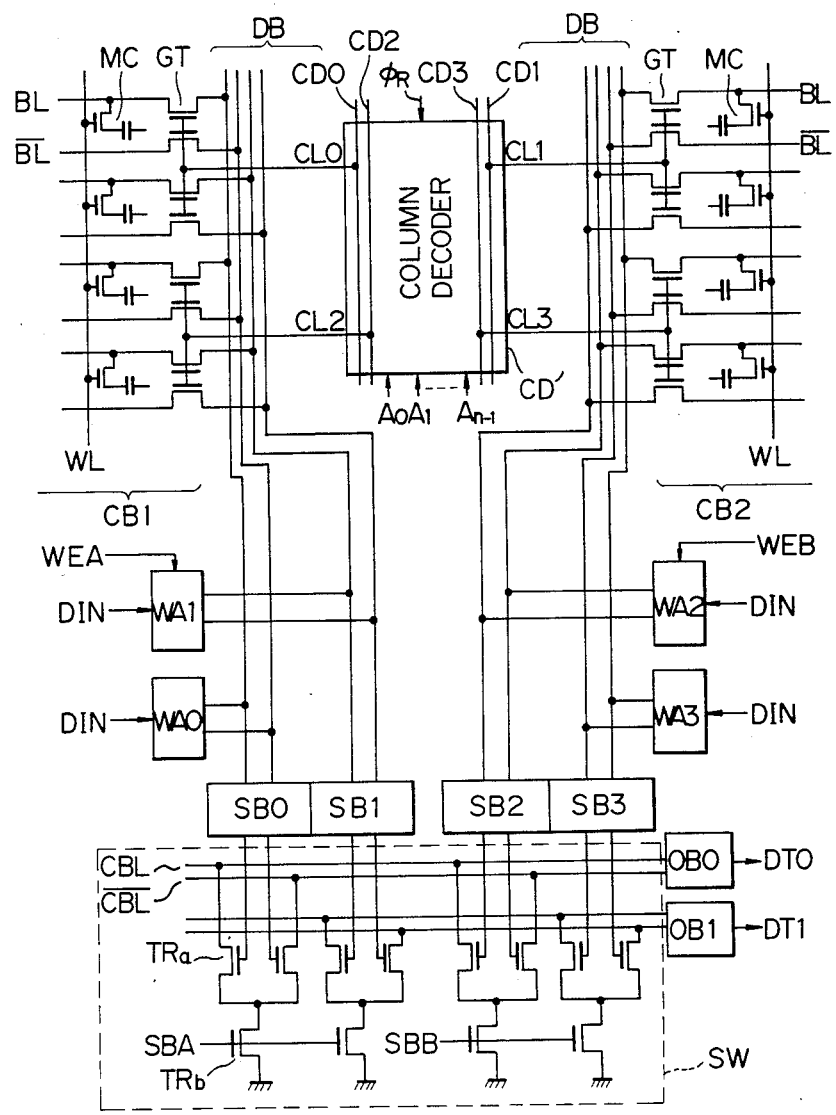
FIG. 8 is a partial detailed circuit diagram of a DRAM according to an embodiment of the present invention.

Referring to FIG. 7, in the first trailing edge shown by reference "0" of the $\overline{CAS}$ signal (this trailing edge is the first trailing edge after the falling of the $\overline{RAS}$ signal), the waveform of the signal $\phi_1$ becomes different from following waveforms. That is, as shown by "T", the signal $\phi_1$ is raised in response to the leading edge of the signal $\phi_0$. Accordingly, the signal $\phi_1$ is set to the "H" level in response to the leading edge of the signal $\phi_0$ and reset to the "L" level in response to the leading edge of the output buffer signal OB. This particular waveform of the signal $\phi_1$ is obtained by the circuit 2 explained in detail in FIG. 12.

In FIG. 7, when the signal $\phi_1$ is raised, the signal $\phi_A$ is also raised. When the signal $\phi_A$ is raised, the signal CD$\phi_A$ is also raised in the block A. Accordingly, the gate signal CD0 is set to the "H" level in response to the first trailing edge "0" of the $\overline{CAS}$ signal.

Next, in the first leading edge shown by "a" of the $\overline{CAS}$ signal, the switching signal CD1 is raised as shown by "a". Similarly, in the leading edge "b" of the $\overline{CAS}$ signal, the gate signal CD2 is raised as shown by "b", and in the leading edge "c" of the $\overline{CAS}$ signal, the gate signal CD3 is raised as shown by "c". Moreover, in the leading edge "d" of the $\overline{CAS}$ signal, the first gate signal CD0 is raised as shown by "0". These steps are repeated in the nibble mode.

Meanwhile, in the trailing edge "1" of the $\overline{CAS}$ signal, the gate signal CD0 has fallen as shown by "1". Similarly, in the trailing edge "2" of the $\overline{CAS}$ signal, the gate signal CD1 has fallen as shown by "2", and in the trailing edge "3" of the $\overline{CAS}$ signal, the gate signal CD2 has fallen as shown by "3". In these waveforms CD0 to CD3, the dotted lines represent conventional waveforms as shown in FIG. 4.

In comparison with the conventional waveforms, in the present invention, the gate signal CD0 is set in the first trailing edge of the $\overline{CAS}$ signal in the initial step, and subsequently, each gate signal is set in response to the leading edge of the $\overline{CAS}$ signal. Moreover, each gate signal is reset in response to following trailing edge of the $\overline{CAS}$ signal. Conversely, in the conventional timing, the gate signals CD0 and CD1 are set simultaneously in response to the first trailing edge of the $\overline{CAS}$ signal, the gate signal CD2 is set in response to the next trailing edge of the $\overline{CAS}$ signal, and the gate signal CD3 is also set in response to following trailing edge of the $\overline{CAS}$ signal. Moreover, each gate signal is reset in response to each trailing edge of the $\overline{CAS}$ signal.

As is obvious from the timing chart shown in FIG. 7, by comparing the solid lines with the dotted lines in each waveform of the gate signal CD0 to CD3, the timing of the trailing edge is delayed in comparison with the trailing edge shown by the dotted line. Accordingly, since the ON time of the gate signal is increased by this delay time, a sufficient write operation time can be obtained by this method.

In this case, the signals $\phi_A$ and $\phi_B$ are alternately generated by the circuits 3A and 3B. These signals are obtained by dividing the frequency of the signal $\phi_1$. The signal CD$\phi_A$ is set in response to the leading edge of the signal $\phi_A$, and reset in response to the leading edge of the signal $\phi_0$ and "H" level of the signal $\phi_B$. The signal CD$\phi_B$ is set in response to the leading edge of the signal $\phi_B$, and reset in response to the leading edge of the signal $\phi_0$ and "H" level of the signal $\phi_A$. The signal CD$\phi_A$ is divided into two gate signals CD0 and CD2 in the decoder 5A, and the signal CD$\phi_B$ into two gate signals CD1 and CD3 in the decoder 5B.

Referring to FIG. 8, the sense amplifiers SB0 to SB3 are activated by the signals SBA and SBB. The signal SBA activates the sense amplifiers SB0 and SB1 in the first cell block CB1, and the signal SBB activates the sense amplifiers SB2 and SB3 in the second cell block CB2. The data in these sense amplifiers is output through the output buffers OB0 and OB1 as the output data DT0 and DT1.

In the figure WA0 to WA3 represent write amplifiers, CBL and $\overline{CBL}$ common buses, WEA and WEB clock signals for driving write amplifiers, and DIN input data.

SW represents a detailed switching circuit which is the same circuit SW as shown in FIG. 3. This circuit SW is used for switching the sense amplifiers. The write amplifier is provided to each data bus DB, i.e., is provided in the same number as that of the sense amplifiers. This write amplifier amplifies the input data DIN and transfers it to the data bus DB. The write enable signals WEA and WEB are alternately input as shown in FIG. 7. The signal WEA is set in response to the leading edge of the signal CD$\phi_A$ and reset in response to the trailing edge of the signal CD$\phi_A$. Similarly, the signal WEB is set in response to the leading edge of the signal CD$\phi_B$ and reset in response to the trailing edge of the signal CD$\phi_B$.

Each output of the sense amplifiers SB0 to SB3 is transferred to the common buses CBL and $\overline{CBL}$ through the transistor TR$_a$. Accordingly, the data in the first cell block CB1, i.e, the data in the sense amplifiers SB0 and SB1, is output to the data buses CBL and $\overline{CBL}$ in response to the switching of the signals SBA and SBB. As mentioned above, the signals SBA and SBB are generated from the circuits 4A and 4B through the buffers 6A and 6B, as shown in FIG. 6. The column decoder CD' is explained in detail in FIG. 9.

Figure 9:
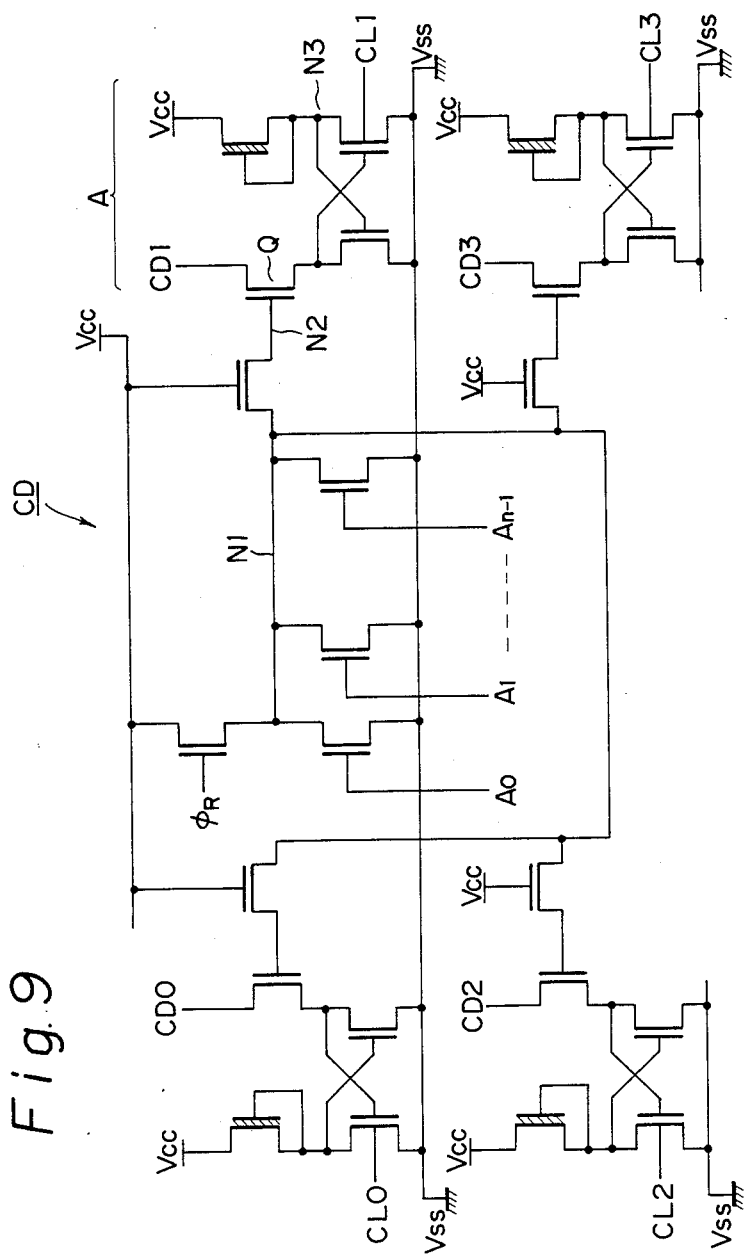
FIG. 9 is a detailed circuit diagram of the column decoder shown in FIG. 8.

Referring to FIG. 9, $A_0$ to $A_{n-1}$ represent input address signals, and $\phi_R$ represents a reset signal which has fallen to the "L" level in the same timing as $\overline{CAS}$ signal. However, this signal $\phi_R$ is held at the "L" level regardless of whether the $\overline{CAS}$ signal is "H" or "L". The gate signals CD0 to CD3 are input from the column decoders 5A and 5B in FIG. 6. The input timings of these signals are shown in FIG. 7. CL0 to CL3 represent column lines connected between the column decoder CD' and the bit line BL.

The operation of this circuit will be explained with respect to a partial circuit A containing the signal CD1 and the column line CL1. Other portions in this circuit are omitted since the operation thereof is the same as the above portion.

When the signal $\phi_R$ is in the reset state, the modes N1 and N2 are previously charged. Whether or not these precharged nodes N1 and N2 are discharged is determined in correspondence with the address signals $A_0$ to $A_{n-1}$. The nodes N1 and N2 of the selected decoder are not discharged and maintained at the "H" level. Next, when the input gate signal CD1 is at the "H" level, this "H" level signal is output to the line CL1 through the transistor Q because the transistor Q is turned ON by "H" level of the node N2. When the gate signal CD1 is "L" level, charges at the line CL1 are pulled out to the CD1 side through the transistor Q and this partial circuit A is returned to an initial state. As explained above, since the gate signals CD0 to CD3 are alternately input at the "H" and "L" levels, the lines CL0 to CL3 are alternately selected. Therefore, the data on the bit lines is output to the data bus DB in correspondence with the column line CL.

Figure 10:
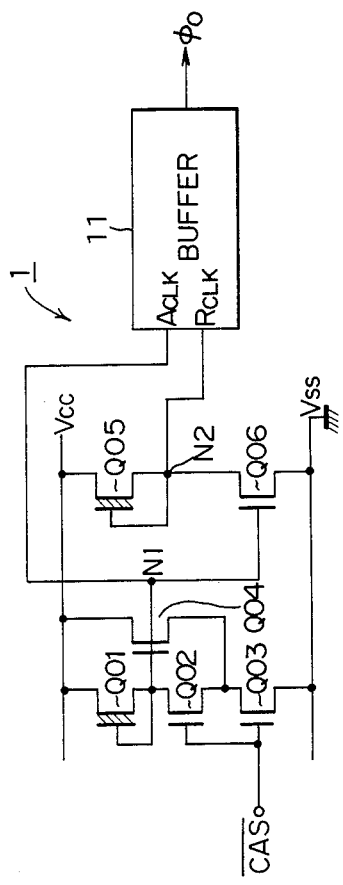
FIG. 10 is a detailed circuit diagram of a signal $\phi_0$ generating circuit shown in FIG. 6.

Referring to FIG. 10, Q01 and Q05 are depletion type transistors, and Q02, Q03, Q04 and Q06 are enhancement type transistors. All transistors Q01 to Q06 are N-channel transistors. When the $\overline{CAS}$ signal is input to the transistors Q02 and Q03, an inverted signal is obtained in the node N1, and the same phase signal is obtained in the node N2. These signals are input to the terminals $A_{CLK}$ and $R_{CLK}$ in the buffer 11. The inverted signal is amplified in the buffer 11 and the amplified signal $\phi_0$ is output from the buffer 11.

Figure 11:
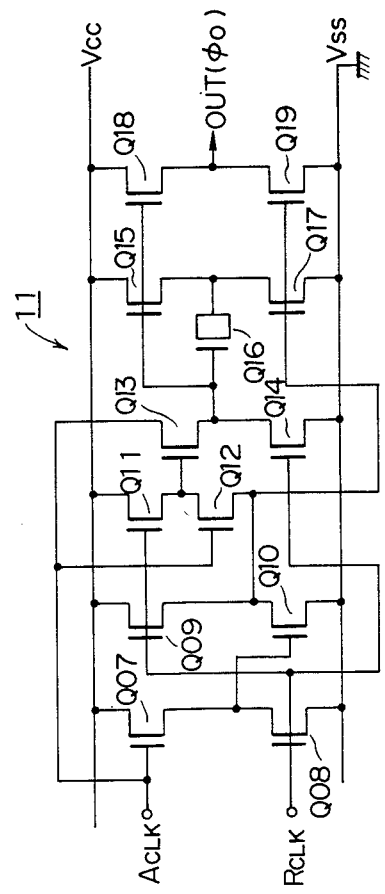
FIG. 11 is a detailed circuit diagram of a buffer circuit shown in FIG. 10.

Referring to FIG. 11, Q16 represents a capacitor, and all transistors Q07 to Q19 are N-channel enhancement type transistors. The inverted $\overline{CAS}$ signal is amplified by this circuit and the inverter signal $\phi_0$ is obtained.

Figure 12:
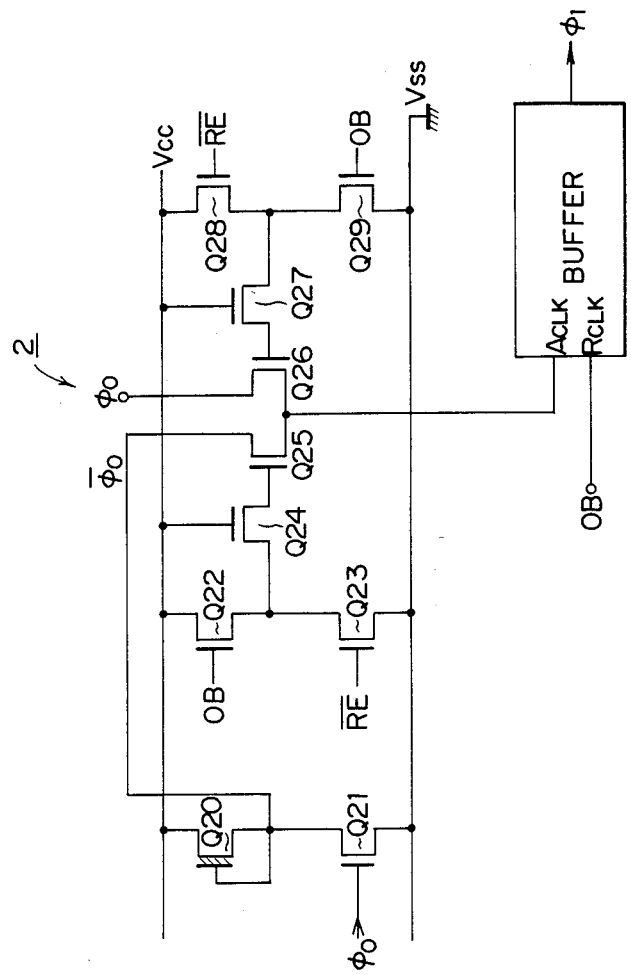
FIG. 12 is a detailed circuit diagram of a signal $\phi_1$ generating circuit shown in FIG. 6.

Referring to FIG. 12, a signal $\overline{RE}$ represents an amplified $\overline{RAS}$ signal. That is, this signal $\overline{RE}$ has the same phase as that of the $\overline{RAS}$ signal and is obtained by an internal circuit. As explained in FIG. 7, the signal $\phi_1$ has the same phase waveform as the signal $\phi_0$ in the first trailing edge of the $\overline{CAS}$ signal. That is, the signal $\phi_1$ is set in response to the leading edge of the signal $\phi_0$ and reset in response to the leading edge of the output buffer signal OB. This timing of the signal $\phi_1$ is obtained by the following operations. That is, when the signal $\overline{RE}$ is "H" level, the transistor Q28 is turned ON and the transistor Q26 is also turned ON because the transistor Q27 is already turned ON. Accordingly, the signal $\phi_0$ is passed to the buffer through the transistor Q26 and is output as the signal $\phi_1$. Next, the signal OB is generated through the buffer 7 as shown in FIG. 6 based on the signal $\phi_0$. The signal OB is input to the transistor Q29, and this transistor Q29 is then turned ON. Accordingly, the transistor Q26 is turned OFF because charged electrons in the base of the transistor Q26 are pulled to the ground through the transistor Q29. Accordingly, the signal $\phi_1$ is made to fall because the signal $\phi_0$ is cut off.

When the signal $\overline{RE}$ is "H" level, the transistor Q23 is turned ON. Accordingly, the transistor Q25 is turned OFF and the inverted signal $\phi_0$ is not passed. Next, since the transistor Q22 is turned ON, the transistor Q25 is turned ON so that the signal $\phi_0$ can be passed to the buffer through the transistor Q25. Accordingly, an amplified inverted signal $\phi_0$, i.e., signal $\phi_1$ is obtained from the buffer.

Figure 13:
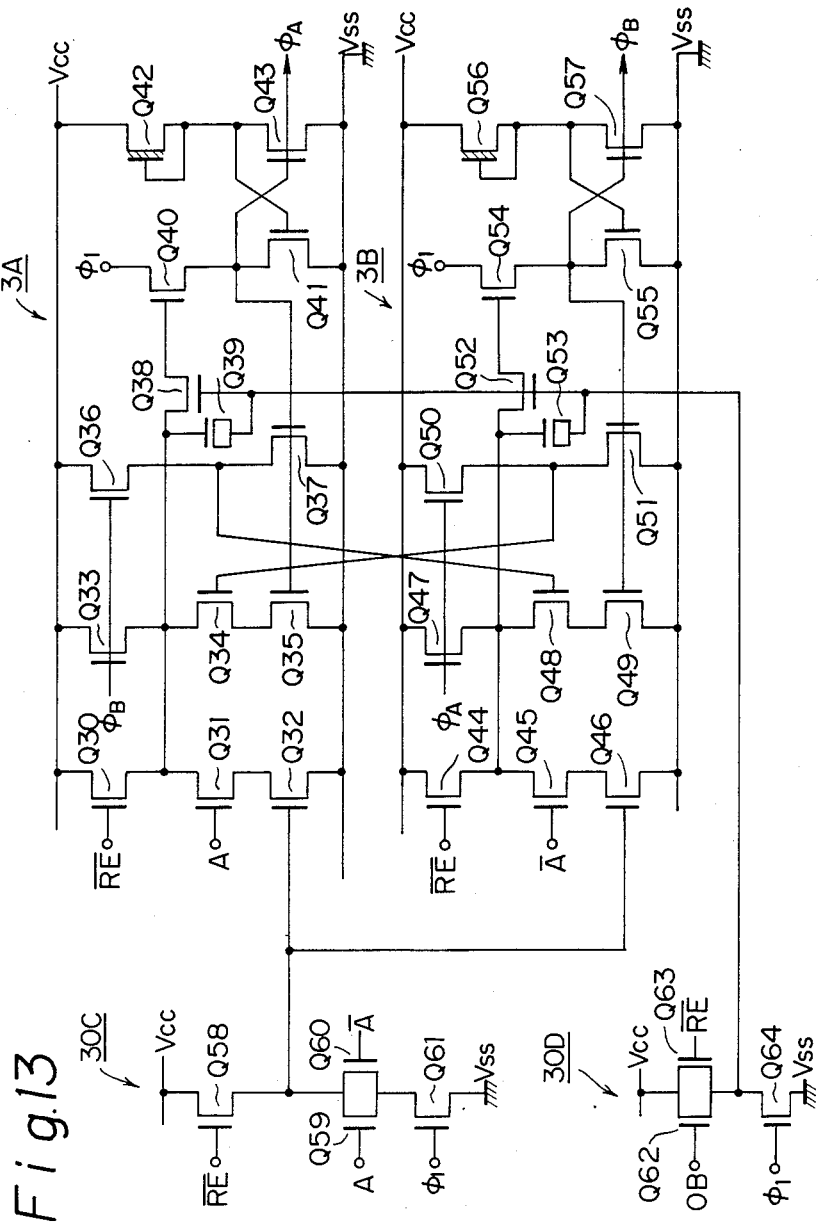
FIG. 13 is a detailed circuit diagram of signals $\phi_A$ and $\phi_B$ generating circuit shown in FIG. 6.

Referring to FIG. 13, this circuit is provided for dividing the signal $\phi_1$ into two signals, $\phi_A$ and $\phi_B$, each having a half frequency of the signal $\phi_1$ as shown in FIG. 7. The signal $\phi_1$ is input to the transistors Q40, Q54, Q61, and Q64; address signals A and $\overline{A}$ are input to the transistors Q31, Q45, Q59, and Q60; and the signal $\overline{RE}$ is input to the transistors Q30, Q44, Q58, and Q63. The signal $\phi_A$ is returned to the transistor Q47, and the signal $\phi_B$ is returned to the transistor Q33. The gates of the transistors Q40 and Q54 are controlled by the control circuit 30D through the transistors Q38 and Q52, and the gates of the transistors Q32 and Q46 are controlled by the control circuit 30C. The drawing of these control circuits 30C and 30D is based on the signals A, $\overline{A}$, $\phi_1$, e,ovs/RE/ , and OB.

When the address signal $\overline{A}$ is, for example, "H" level, the transistor Q54 is turned OFF because the transistor Q45 and Q46 is turned ON and charges of the gate of the transistor Q54 are pulled to the ground. Accordingly, the signal $\phi_1$ cannot be passed through the transistor Q54 so that the signal $\phi_B$ is not obtained. In this case, since the address signal A is "L" level, the transistor Q40 is turned ON because the transistor Q31 is turned OFF and the gate of the transistor Q40 is "H" level. Accordingly, the signal $\phi_1$ can be passed through the transistor Q40 so that the signal $\phi_A$ can be obtained.

This signal $\phi_A$ is input to the transistor Q47 so that the transistor Q54 is turned ON. Accordingly, the signal $\phi_1$ is passed through the transistor Q54 and the signal $\phi_B$ is obtained. In this case, the signal $\phi_A$ is also fed back to the transistor Q35 so that the transistor Q40 is turned OFF and the signal $\phi_1$ is not passed in this step. When the signal $\phi_B$ is "H" level, this signal is input to the transistor Q33 so that this transistor Q33 is turned ON. These cycles are repeated so that the signal $\phi_1$ can be divided into two signals $\phi_A$ and $\phi_B$.

Figure 14:
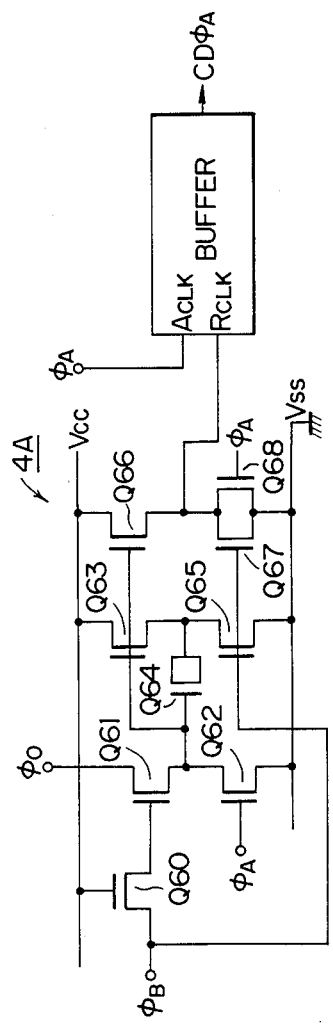
FIG. 14 is a detailed circuit diagram of a signal $CD\phi_A$ generating circuit shown in FIG. 6.
Figure 15:
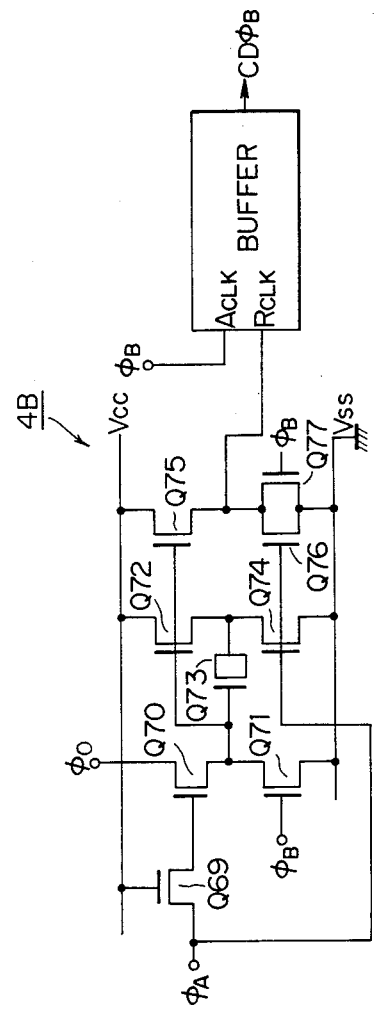
FIG. 15 is a detailed circuit diagram of a signal $CD\phi_B$ generating circuit shown in FIG. 6.

Referring to FIGS. 14 and 15, these circuits are used for generating signals $CD\phi_A$ and $CD\phi_B$. In FIG. 14, the signal $CD\phi_A$ is obtained based on the signals $\phi_0$, $\phi_A$, and $\phi_B$. These signals are defined by the timings shown in FIG. 7. The signal $CD\phi_A$ is set in response to the leading edge of the signal $\phi_A$ and reset in response to the "H" level of the signal $\phi_B$ and the leading edge of the signal $\phi_0$.

This resetting operation is as follows. When the signal $\phi_B$ is "H" level, as shown in FIG. 7, the transistor Q61 is turned ON, and when the signal $\phi_0$ is raised during the "H" level of the signal $\phi_B$, the signal $\phi_0$ is applied to the transistor Q66 through the transistor Q61. Accordingly, the transistor Q66 is turned ON, the "H" level signal is applied to the reset terminal $R_{CLK}$, and the signal $CD\phi_A$ is reset.

The same explanation as the above can be applied to FIG. 15. Accordingly, a detailed explanation thereof will be omitted. In FIG. 15, the signal $CD\phi_B$ is set in response to the leading edge of the signal $\phi_B$ and reset in response to "H" level of the signal $\phi_A$ and the leading edge of the signal $\phi_0$.

We claim:
1. A semiconductor memory device having a nibble mode function comprising:
  memory cell arrays divided into two groups of first and second cell blocks;
  data bus lines provided separately to each of said first and second cell blocks;
  sense amplifiers provided separately to each of said data bus lines;
  a column decoder connecting between bit lines, provided in said memory cell array, and corresponding data bus lines based on address signals and gate signals in a selection state;
  switching means for switching between sense amplifiers belonging to said first cell block and sense amplifiers belonging to said second cell block and for connecting these sense amplifiers to output buffers; and a clock signal generating means for generating said gate signals, said gate signals being generated in such a way that each respective gate signal is raised in response to a corresponding leading edge of a column address strobe signal and is allowed to fall in response to a trailing edge of said column address strobe signal in said nibble mode.

2. A semiconductor memory device having a nibble mode function as claimed in claim 1, wherein each said gate signal is raised in response to a first trailing edge of the column address strobe signal only in a starting step of the nibble mode, after this step, the leading edge of the column address strobe signal is used for raising the gate signal and the trailing edge of the column address strobe signal for lowering the gate signal as the nibble mode.

3. A semiconductor memory device having a nibble mode function as claimed in claim 2, wherein said first trailing edge of the column address strobe signal is a first trailing edge after the falling of a row address strobe signal.

* * * * *